(12) United States Patent
Lee et al.

(10) Patent No.: US 6,767,129 B2
(45) Date of Patent: Jul. 27, 2004

(54) MICROWAVE POWER SENSOR AND METHOD FOR MANUFACTURING THE SAME

(75) Inventors: Dae Sung Lee, Kyunggi-do (KR); Kyung Il Lee, Seoul (KR); Hak In Hwang, Kyunggi-do (KR)

(73) Assignee: Korea Electronics Technology Institute (KR)

( * ) Notice: Subject to any disclaimer, the term of this patent is extended or adjusted under 35 U.S.C. 154(b) by 0 days.

(21) Appl. No.: 10/287,585

(22) Filed: Nov. 5, 2002

(65) Prior Publication Data

US 2004/0057495 A1 Mar. 25, 2004

(30) Foreign Application Priority Data

Sep. 3, 2002 (KR) ........................................ 2002-52856

(51) Int. Cl.[7] ................................................. G01K 7/02
(52) U.S. Cl. ........................ 374/122; 374/32; 374/179; 324/95; 324/96; 324/104; 324/106; 257/467
(58) Field of Search ........................ 374/122, 178–179, 374/31, 32; 324/95–96, 104–106; 257/428–430, 467

(56) References Cited

U.S. PATENT DOCUMENTS

| | | | | |
|---|---|---|---|---|
| 4,733,170 A | | 3/1988 | McAllister et al. ........... 324/95 |
| 4,789,823 A | * | 12/1988 | Delfs et al. .................... 324/95 |
| 4,943,764 A | * | 7/1990 | Szente et al. .................. 324/95 |
| 5,302,024 A | | 4/1994 | Blum .......................... 374/122 |
| 5,370,458 A | | 12/1994 | Goff ............................ 374/122 |
| 5,600,174 A | * | 2/1997 | Reay et al. .................. 257/467 |
| 6,242,901 B1 | | 6/2001 | Faick et al. ................... 324/95 |
| 6,303,976 B1 | | 10/2001 | Gaitan et al. ............... 257/619 |
| 6,304,229 B1 | * | 10/2001 | Lee et al. .................... 343/795 |

* cited by examiner

*Primary Examiner*—Diego Gutierrez
*Assistant Examiner*—Stanley J. Pruchnic, Jr.
(74) *Attorney, Agent, or Firm*—Bacon & Thomas, PLLC

(57) ABSTRACT

A microwave power sensor and a method for manufacturing the same. The microwave power sensor includes a semiconductor substrate with a nitride or oxide film formed thereon. A membrane which is a portion of the nitride or oxide film is floated by removing a portion of the semiconductor substrate. First and second thermocouple groups are formed to be symmetrically spaced apart from each other on the membrane. An RF input end is formed on the nitride or oxide film. A heating resistor is formed on the membrane to be connected with the RF input end. First and second ground plates are formed on the nitride or oxide film at both sides of the RF input end. A third ground plate is formed on the nitride or oxide film to be connected with the heating resistor and electrically connected with the first and second ground plates. The first and second output terminals are formed on the semiconductor substrate to be connected with the first and second thermocouple groups, respectively.

12 Claims, 6 Drawing Sheets

MICROWAVE POWER SENSOR AND METHOD FOR MANUFACTURING THE SAME

BACKGROUND OF THE INVENTION

1. Field of the Invention

The present invention relates to a microwave power sensor and a method for manufacturing the same, and more particularly, to a microwave power sensor and a method for manufacturing the same, in which a heating resistor is connected with an input end and thermocouples are formed to be bilaterally symmetrical with respect to the heating resistor, so that it is easy to match impedance, an amount of reflection loss due to any parasitic components is small, and a linear output voltage proportional to an input electric power is obtained; and ground plates capable of radiating heat are further formed to be spaced apart from and around the heating resistor, so that the sensitivity of the sensor can be enhanced thanks to its high thermal impedance.

2. Description of the Prior Art

Generally, wireless communications can be made through smooth transmission of signals between transmitting and receiving ends.

At this time, if an RF (radio frequency) signal having insufficient electric power is transmitted from the transmitting end to the receiving end, the RF signal received by the receiving end cannot generate a desired output level.

For example, if a broadcast signal transmitted from a broadcasting station has insufficient electric power, a broadcasting image is distorted or a noisy voice is outputted in a television set, which is operated by the received broadcast signal.

Accordingly, in the wireless communications such as mobile communications and TV broadcasting, accurate measurement of signal electric power is the most basic and essential factor in transmitting and receiving information.

Recently, as there is a tendency for RF parts to be integrated, development of electric power sensors compatible with MMIC (monolithic microwave IC) or CMOS RF-IC has been attempted. Typically, NIST (U.S. National Institute of Standards and Technology) published a sensor employing thin films obtained through a CMOS standard process and diaphragms obtained through XeF$_2$ dry etching.

However, the sensor can be used only in relatively low input power in view of characteristics thereof. Since the sensor is connected to a heating resistor having a relatively larger size compared to the wavelength of the microwave input, perpendicularly to a proceeding direction thereof, it is difficult to match impedance in broadband.

Moreover, since a ground electrode serving as a heat radiation plate is in the vicinity of the heating resistor, heat loss is increased.

In addition, since thermocouple temperature sensors cannot be disposed only at one side of the heating resistor, the conversion efficiency of the sensor is inevitably lowered.

Further, since a silicon surface, which has been removed by the dry etching, corresponding to a lower portion of the sensor is difficult to be flat, there are disadvantages in that impedance of a transmission line is not constant, and high manufacturing costs are expended.

SUMMARY OF THE INVENTION

Accordingly, the present invention is contemplated to solve the above problems in the prior art. An object of the present invention is to provide to a microwave power sensor and a method for manufacturing the same, in which a heating resistor is connected with an input end and thermocouples are formed to be bilaterally symmetrical with respect to the heating resistor, so that it is easy to match impedance, an amount of reflection loss due to any parasitic components is small, and a linear output voltage proportional to an input electric power is obtained; and ground plates capable of radiating heat are further formed to be spaced apart from and around the heating resistor, so that the sensitivity of the sensor can be enhanced thanks to its high thermal impedance.

According to an aspect of the present invention for accomplishing the objects, there is provided a microwave power sensor comprising a semiconductor substrate with a nitride or oxide film formed thereon; a membrane which is a portion of the nitride or oxide film is floated by removing a portion of the semiconductor substrate; first and second thermocouple groups are formed to be symmetrically spaced apart from each other on the membrane; an RF input end is formed on the nitride or oxide film; a heating resistor is formed on the membrane to be connected with the RF input end; first and second ground plates are formed on the nitride or oxide film at both sides of the RF input end; a third ground plate is formed on the nitride or oxide film to be connected with the heating resistor and electrically connected with the first and second ground plates; and first and second output terminals are formed on the semiconductor substrate to be connected with the first and second thermocouple groups, respectively.

According to an aspect of the present invention for accomplishing the objects, there is provided a method for manufacturing a microwave power sensor comprising a first step of forming top and bottom silicon nitride films on top and bottom surfaces of a silicon substrate, respectively, and etching an inner side of the bottom silicon nitride film to expose the bottom surface of the silicon substrate; a second step of forming one kind of polysilicon patterns for thermocouples and a polysilicon pattern for a heating resistor on the top silicon nitride film; a third step of depositing a metal on the top silicon nitride film to form the other kind of metal patterns for the thermocouples, and metal patterns for an RF input end, ground plates and output terminals; a fourth step of exposing the metal patterns corresponding to the ground plates and forming a sacrificial layer on the whole surface; a fifth step of removing the sacrificial layer to expose the metal patterns corresponding to the ground plates; a sixth step of depositing a seed layer for electroplating on the whole surface of the sacrificial layer and the exposed metal patterns; a seventh step of forming a electroplating wall on the seed layer, an eighth step of electroplating a metal inside of the electroplating wall to form a ground electrode for electrically connecting the metal patterns corresponding to the ground plates; a ninth step of removing the sacrificial layer and the electroplating wall so that the ground electrode is floated from the substrate; and a tenth step of removing the bottom surface of the exposed silicon substrate so that the polysilicon pattern for the heating resistor and a portion of the silicon nitride film around the polysilicon pattern are floated.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE INVENTION

Hereinafter, a preferred embodiment of the present invention will be described with reference to the accompanying drawings.

Figure 1:
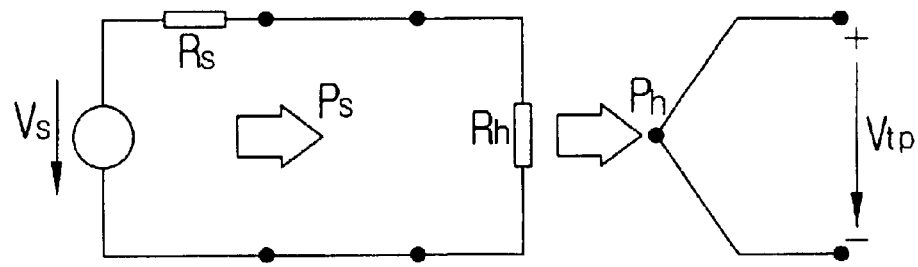
FIG. 1 is an equivalent circuit diagram of a microwave power sensor according to the present invention.

FIG. 1 is an equivalent circuit diagram of a microwave power sensor according to the present invention. The present invention is directed to the constitution of a microwave power sensor which uses the equivalent circuit shown in FIG. 1 to obtain an output voltage by converting microwave electric power into heat and then measuring the heat with temperature sensors, and a method for manufacturing the microwave power sensor.

Accordingly, by converting the microwave electric power into beat and then sensing the heat, the output voltage can be obtained with respect to the microwave electric power by the following equation (1):

$$V_{tp} = \frac{\alpha N}{G_{th}} \frac{V^2}{R_h} = \frac{\alpha N}{G_{th}} P_h = \frac{\alpha N}{G_{th}} P_s (1 - |\Gamma|^2), \quad (1)$$

where N is the number of thermocouples, a is a thermoelectric coefficient (V/K), $G_{th}$ is thermal conductivity of the sensor (W/K), and $\Gamma$ is a reflection coefficient of the microwave.

Therefore, as shown in FIG. 1, if all the inputted microwave electric power $P_s$ is caused to be consumed/converted into heat by terminating ends of a transmission line to an impedance-matched resistor $R_h$, and a temperature change due to the consumed microwave electric power $P_h$ is measured by placing a hot junction of an array of thermocouples at a to position adjacent to the resistor, the output voltage $V_{tp}$ can be obtained.

Figure 2:
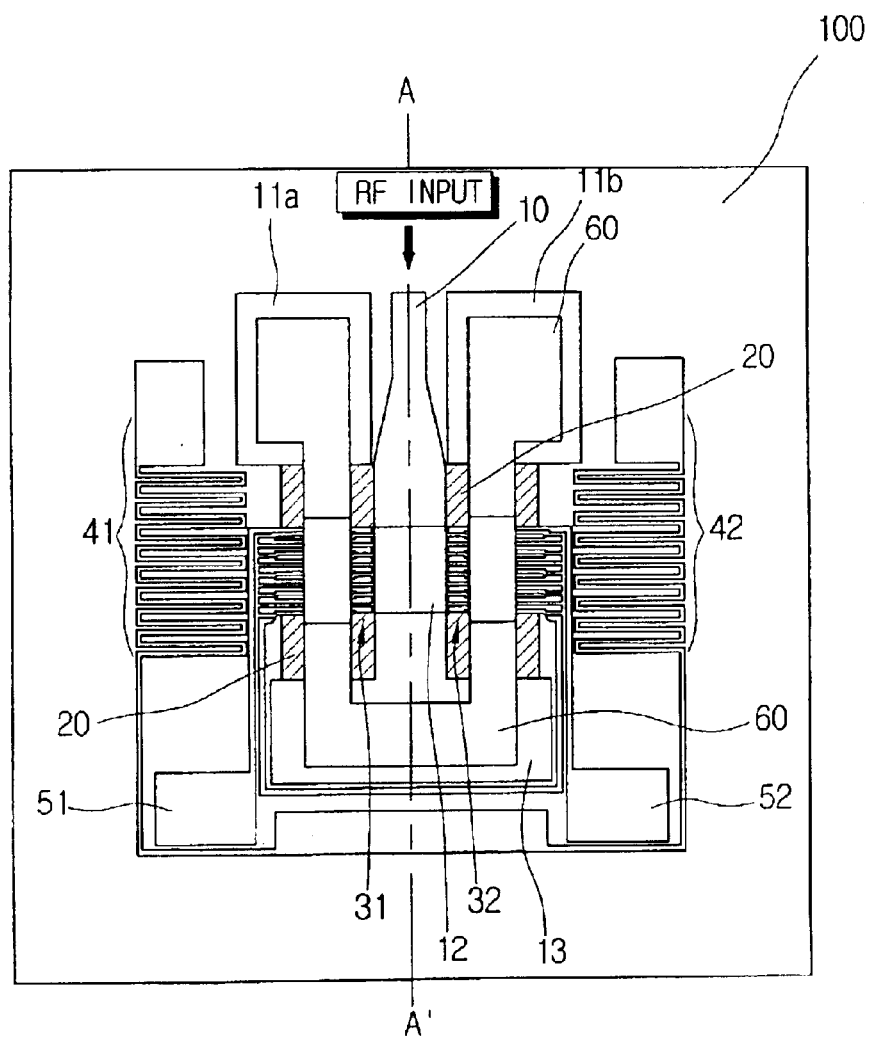
FIG. 2 is a plan view of the microwave power sensor according to the present invention.

FIG. 2 is a plan view of the microwave power sensor according to the present invention. The sensor comprises a silicon substrate 100 with a silicon nitride film formed thereon; a membrane 20 which is a portion of the silicon nitride film floated by removing a portion of the silicon substrate 100; first and second thermocouple groups 31, 32 are formed to be symmetrically spaced apart from each other on the membrane 20; an RF input end 10 is formed on the silicon nitride film of the silicon substrate 100; a beating resistor 12 is formed on the membrane 20 to be connected with the RF input end 10; first and second ground plates 11a, 11b are formed on the silicon nitride film of the silicon substrate 100 at both sides of the RF input end 10; a third ground plate 13 is formed on the silicon nitride film of the silicon substrate 100 to be connected with the heating resistor 12 and electrically connected with the first and second ground plates 11a, 11b; and first and second output terminals 51, 52 are formed on the silicon nitride film of the silicon substrate 100 to be connected with the first and second thermocouple groups 31, 32, respectively.

Here, although the silicon substrate 100 with the silicon nitride film formed thereon is used in the present invention, a silicon substrate with an oxide film formed thereon may be used Moreover, the RF input end 10, the first to third ground plates 11a, 11b and 13, and the first and second output terminals 51, 52 are preferably formed of metal more preferably aluminum.

In addition, in the first and second thermocouple groups 31, 32, each thermocouple of one group comprises a metal pattern and each thermocouple of the other group comprises a polysilicon pattern. Each thermocouple group comprises 10 to 100 thermocouples.

Further, the heating resistor 12 is formed of polysilicon on the silicon nitride film.

In the microwave power sensor of the present invention constructed as such, if an RF signal is inputted into the RF input end 10, heat is generated from the beating resistor 12.

Furthermore, in the first and second thermocouple groups 31, 32, junctions are formed on the silicon nitride film of the silicon substrate, and the other junctions are formed on the membrane 20 adjacent to the heating resistor 12. Accordingly, if a temperature difference is generated between the silicon substrate and the heating resistor, the output voltage from the inputted RF electric power can be measured in the fist and second output terminals 51, 52.

In the meantime, electrical connection of the first and second ground plates 11a, 11b with the third ground plate 13 is implemented by connecting one side of a ground electrode 60 to the first and second ground plates 11a, 11b, connecting the other side of the ground electrode to the third ground plate 13 and forming an extension extending between one side and another side of the ground electrode 60 to be spaced apart vertically from the membrane 20, as shown in FIG. 2.

Here, if the temperature of the heating resistor 12 is increased with input of the RF signal, heat is thermally conducted to the silicon substrate.

At this time, only when the silicon substrate is maintained at room temperature, a reliable temperature difference exists between the silicon substrate and the heating resistor.

However, if the heat is thermally conducted to the silicon substrate, the temperature difference between the silicon substrate and the heating resistor is changed. Since this affects the output voltage, the output voltage should be compensated with the temperature difference change due to such heat conduction to the silicon substrate.

Therefore, the silicon substrate 100 around the membrane 20 is preferably provided with at least one temperature sensor, and the silicon substrate 100 adjacent to the first and second thermocouple groups 31, 32 is most preferably formed with first and second temperature sensors 41, 42, respectively.

The temperature of the silicon substrate is measured with the first and second temperature sensors 41, 42, and thus the output voltage can be compensated with the temperature difference change due to the heat conduction.

FIGS. 3a to 3h are views sequentially showing processes of manufacturing the microwave power sensor according to the present invention, in a state where the microwave power sensor is cut along line A—A' in FIG. 2. First, in FIG. 3a, top and bottom silicon nitride films 112, 111 are formed on top and bottom surfaces of the silicon substrate 100, respectively, and an inner side of the bottom silicon nitride film 111 is etched to expose the bottom surface of the silicon substrate 100.

Figure 3A:
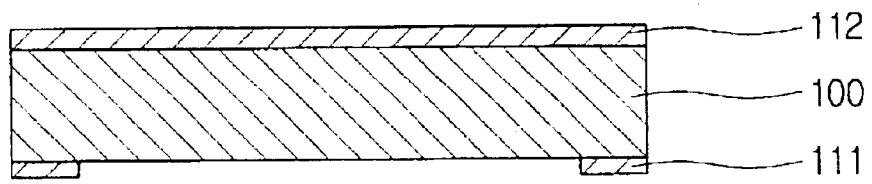
FIGS. 3a to 3h are views sequentially showing processes of manufacturing the microwave power sensor according to the present invention, in a state where the microwave power sensor is cut along line A—A' in FIG. 2.
Figure 3B:
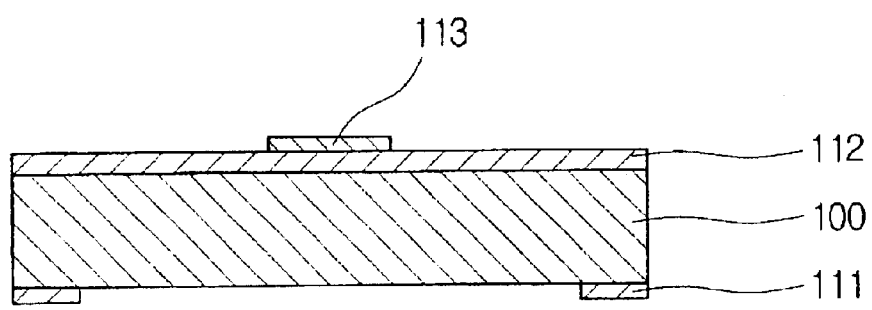

Thereafter, a polysilicon film is deposited on the top silicon nitride film 112, and a photolithography process is performed to form one kind of patterns for the thermocouples and a polysilicon pattern 113 for the heating resistor (see FIG. 3b).

Subsequently, a metal is deposited on the top silicon nitride film 112 to form the other kind of patterns for the thermocouples, and metal patterns 114 for the RF input end, the ground plates and the output terminals (see FIG. 3c).

Figure 3C:
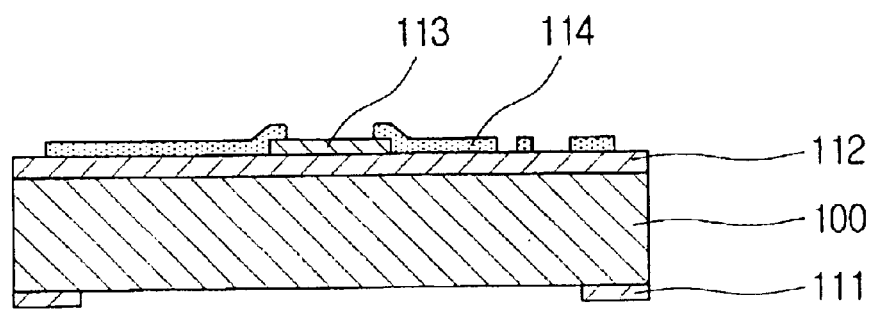

Here, the polysilicon pattern 113 and the metal patterns 114 are overlapped at a position where the RF input end and the heating resistor meet together, so as to be electrically connected to each other, as shown in FIGS. 2 and 3c.

Figure 3D:
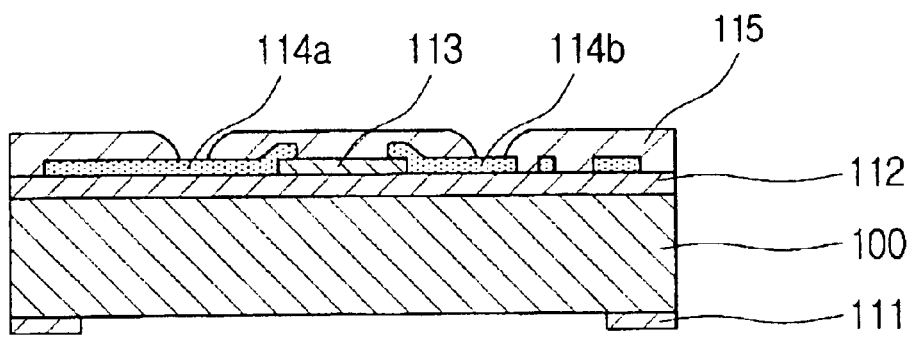

Then, the metal patterns 114 corresponding to the ground plates arm exposed, and a sacrificial layer 115 is formed on the whole surface (see FIG. 3d).

At this time, the sacrificial layer 115 may be formed of photoresist or polyimide, and is then removed by using a photolithography process to expose the metal patterns 114a, 114b corresponding to the ground plates.

Figure 3E:
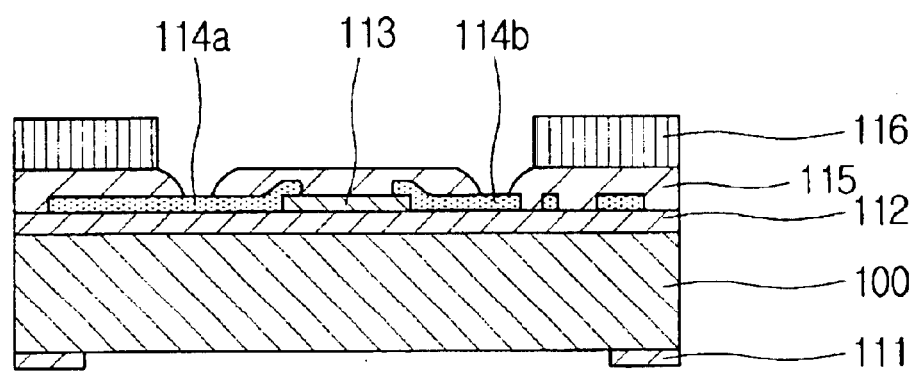

In FIG. 3e, a seed layer for electroplating is deposited on the whole surface of the sacrificial layer 115 and the exposed metal patterns 114a, 114b, and a electroplating wall 116 is formed on the seed layer by using photoresist.

At this time, the seed layer is preferably formed of Ti/Au.

Figure 3F:
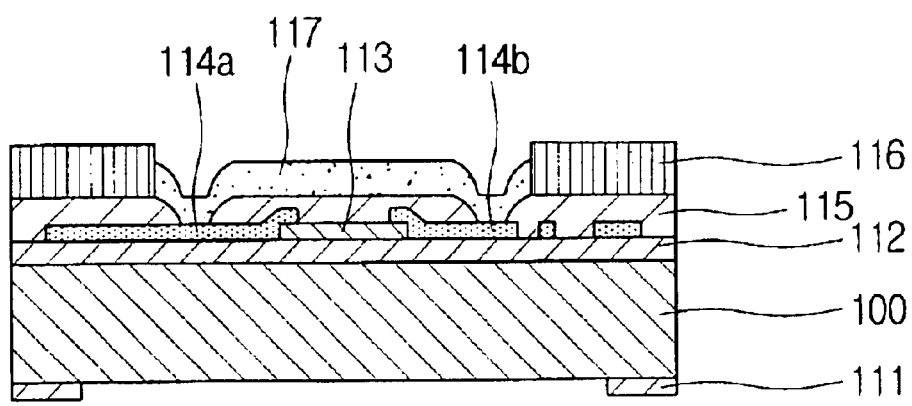

Thereafter, a metal is electroplated inside of the electroplating wall 116 to form a ground electrode 117 for electrically connecting the metal patterns 114a, 114b corresponding to the ground plates (see FIG. 3f).

This ground electrode 117 is the same as the ground electrode 60 shown in FIG. 2.

Figure 3G:
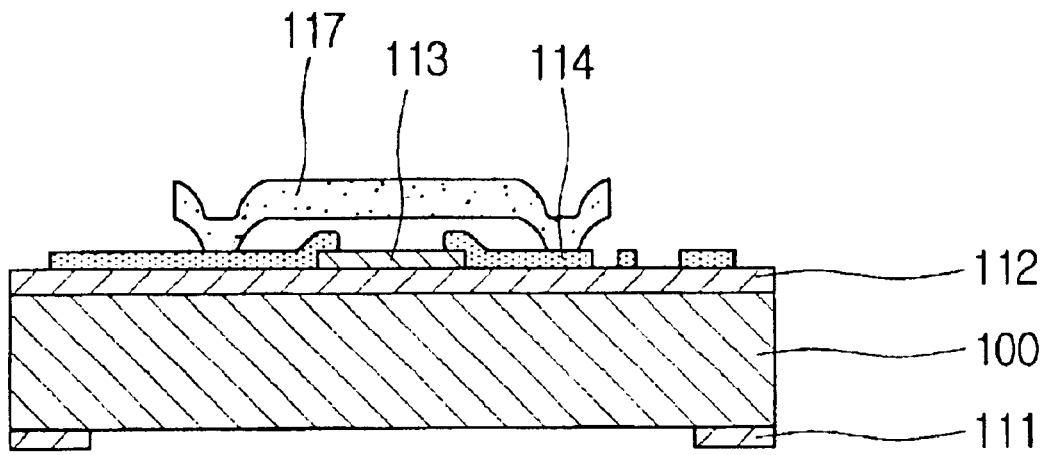

Subsequently, the sacrificial layer 115 and the electroplating wall 116 are removed so that the ground electrode 117 is floated from the substrate (see FIG. 3g).

Figure 3H:
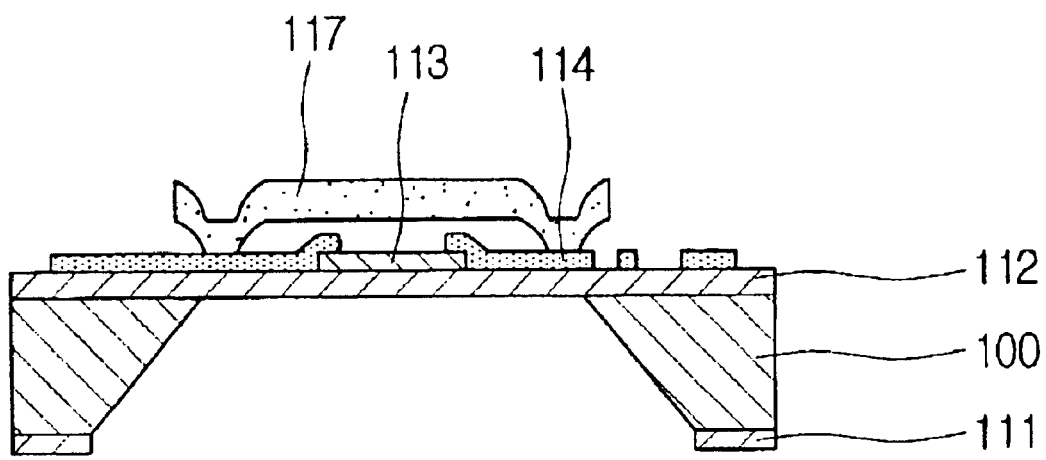

Finally, the bottom surface of the exposed silicon substrate 100 is removed so that the polysilicon pattern for the heating resistor and a portion of the silicon nitride film around the polysilicon pattern are floated (see FIG. 3h).

Figure 4:
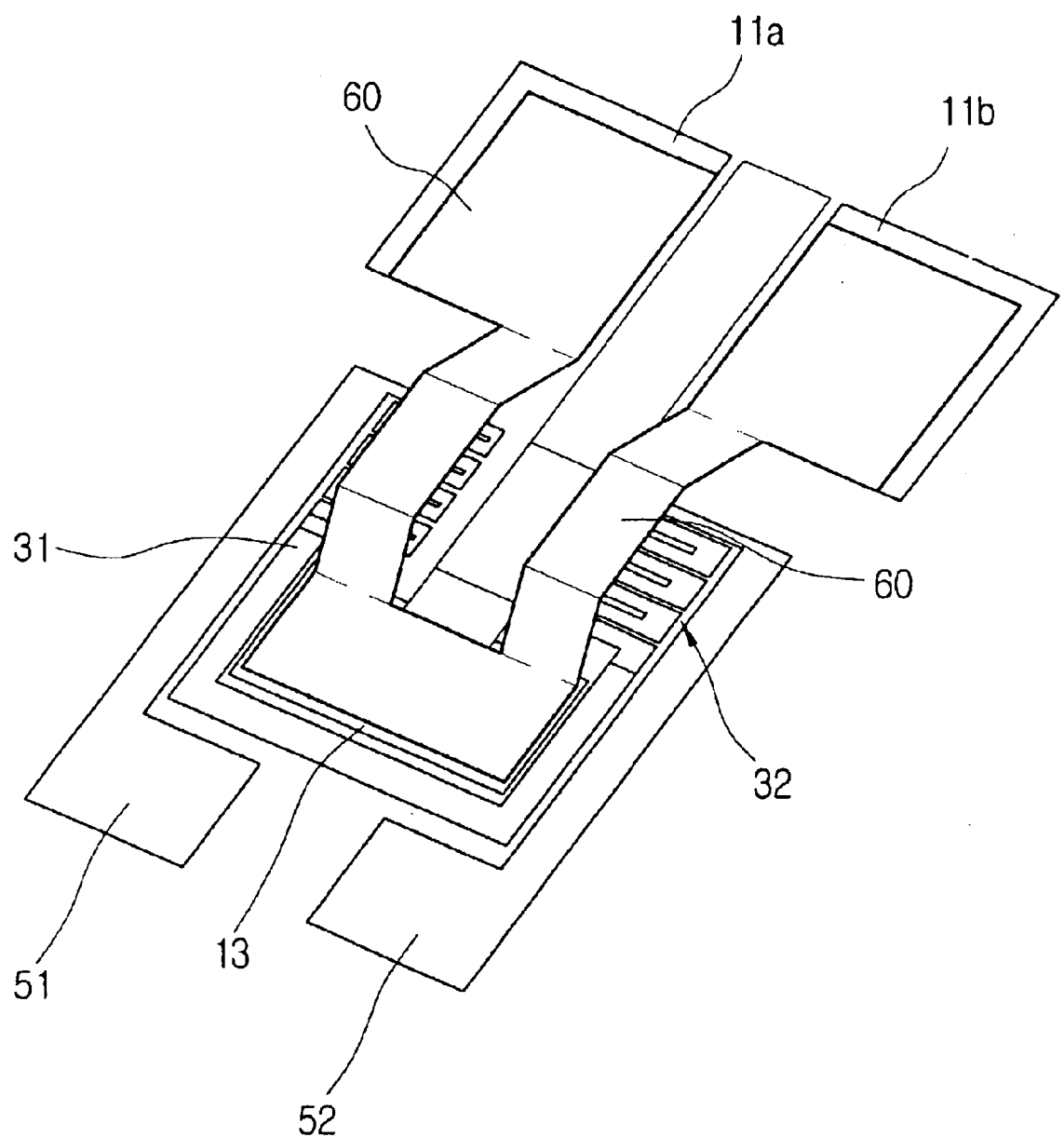
FIG. 4 is a perspective view of a ground electrode for electrically connecting ground plates according to the present invention.

FIG. 4 is a perspective view of a ground electrode for electrically connecting the ground plates according to the present invention. The ground electrode 60 electrically connected to the first to third ground plates 11a, 11b and 13 is floated to be upwardly spaced apart by a predetermined distance from heating resistors 31, 32, which are bilaterally symmetrical to each other.

Figure 5:
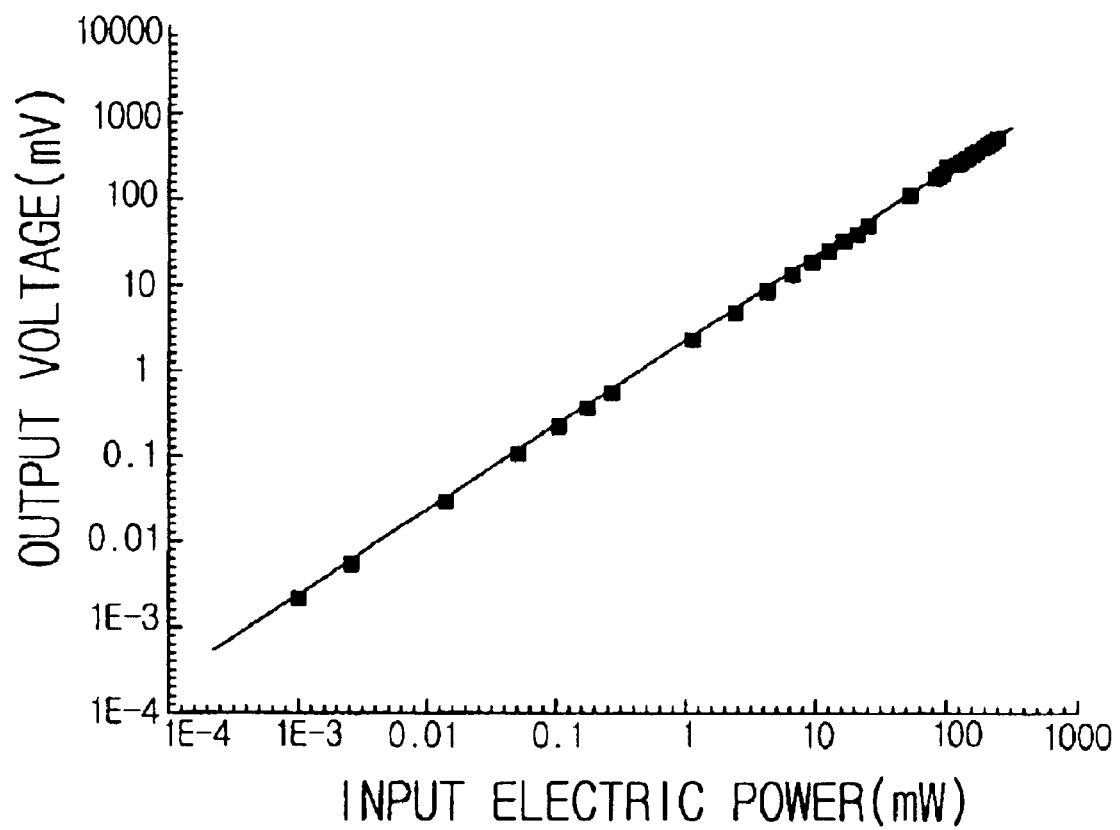
FIG. 5 is a graph showing characteristics of sensitivity and linearity of the microwave power sensor according to the present invention.

FIG. 5 is a graph showing characteristics of sensitivity and linearity of the microwave power sensor according to the present invention. The output voltage is measured with respect to the input electric power. If a microwave of 1 GHz is incident onto the electric power sensor provided with the heating resistor having a width of 210 the electric power sensor has a sensitivity of about 3.2 mV/mW in a power range of 1 $\mu$W to 200 mW, and a linear output voltage was produced.

Therefore, there is an advantage in that superior reliability and a high sensitivity by which the output voltage has a characteristic of linearity with respect to the input electric power can be implemented in the microwave power sensor of the present invention.

As described in detail above, according to the present invention, the heating resistor is connected with the input end and the thermocouples are formed to be bilaterally symmetrical with respect to the heating resistor, so that it is easy to match impedance, an amount of reflection loss due to any parasitic components is small, and the linear output voltage proportional to the input electric power is obtained.

Further, since the ground plates capable of radiating heat are formed to be spaced apart from and around the heating resistor, its thermal impedance becomes higher. Thus, there is an advantage in that the sensitivity of the sensor can be enhanced.

Further, there are advantages in that the manufacturing process is simple, manufacturing costs can be reduced, and the invention can be applied to a radio repeater for cable TVs, a receiver for satellite communications and a collision avoidance system for vehicles.

Although the present invention has been described in detail in connection with the specific embodiment, it is apparent to those skilled in the art that various modifications and changes can be made thereto within the scope and spirit of the present invention. Of course, these modifications and changes arc covered by the appended claims.

What is claimed is:

1. A microwave power sensor, comprising:
    a semiconductor substrate with a nitride or oxide film formed thereon;
    a membrane which is a portion of the nitride or oxide film floated by removing a portion of the semiconductor substrate;
    first and second thermocouple groups formed to be symmetrically spaced apart from each other on the membrane;
    an RF input end formed on the nitride or oxide film;
    a heating resistor formed on the membrane to be connected with the RF input end;
    first and second ground plates formed on the nitride or oxide film at both sides of the RF input end;
    a third ground plate formed on the nitride or oxide film to be connected with the heating resistor and electrically connected with the first and second ground plates; and
    first and second output terminals formed on the semiconductor substrate to be connected with the first and second thermocouple groups, respectively.

2. The microwave power sensor as claimed in claim 1, wherein the semiconductor substrate is a silicon substrate.

3. The microwave power sensor as claimed in claim 1 or 2, wherein the nitride film is a silicon nitride film.

4. The microwave power sensor as claimed in claim 1, wherein each thermocouple of one of the first and second thermocouple groups comprises a metal pattern and each thermocouple of the other of the first and second thermocouple groups comprises a polysilicon pattern.

5. The microwave power sensor as claimed in claim 3, wherein one junctions of the first and second thermocouple groups are formed on the silicon nitride film of the semiconductor substrate, and the other junctions of the first and second thermocouple groups are formed on the membrane adjacent to the heating resistor.

6. The microwave power sensor as claimed in claim 1, wherein the RF input end, the first to third ground plates, and the first and second output terminals are formed of metal.

7. The microwave power sensor as claimed in claim 1 or 2, wherein the heating resistor is formed of polysilicon on the nitride or oxide film.

8. The microwave power sensor as claimed in claim 1 or 2, wherein electrical connection of the first and second ground plates with the third ground plate is made by using a ground electrode in which an extension extending between one side and the other side of the ground electrode is spaced apart vertically from the membrane, the one side of the ground electrode is connected with the first and second ground plates, and the other side thereof is connected with the third ground plate.

9. The microwave power sensor as claimed in claim 1, wherein at least one temperature sensor is provided on the nitride or oxide film of the semiconductor substrate around the membrane.

10. A method for manufacturing a microwave power sensor, comprising:

a first step of forming top and bottom silicon nitride films on top and bottom surfaces of a silicon substrate, respectively, and etching an inner side of the bottom silicon nitride film to expose the bottom surface of the silicon substrate;

a second step of forming one kind of polysilicon patterns for thermocouples and a polysilicon pattern for a heating resistor on the top silicon nitride film;

a third step of depositing a metal on the top silicon nitride film to form the other kind of metal patterns for the thermocouples, and metal patterns for an RF input end, ground plates and output terminals;

a fourth step of exposing the metal patterns corresponding to the ground plates and forming a sacrificial layer on the whole surface;

a fifth step of removing the sacrificial layer to expose the metal patterns corresponding to the ground plates;

a sixth step of depositing a seed layer for electroplating on the whole surface of the sacrificial layer and the exposed metal patterns;

a seventh step of forming an electroplating wall on the seed layer;

an eighth step of electroplating a metal inside of the electroplating wall to form a ground electrode for electrically connecting the metal patterns corresponding to the ground plates;

a ninth step of removing the sacrificial layer and the electroplating wall so that the ground electrode is floated from the substrate; and a tenth step of removing the bottom surface of the exposed silicon substrate so that the polysilicon pattern for the heating resistor and a portion of the silicon nitride film around the polysilicon pattern are floated.

11. The method as claimed in claim 10, wherein the sacrificial layer is formed of photoresist or polyimide.

12. The method as claimed in claim 10, wherein the electroplating wall is formed of photoresist.

* * * * *